(12) United States Patent
Diglio et al.

(10) Patent No.: US 10,775,414 B2
(45) Date of Patent: Sep. 15, 2020

(54) LOW-PROFILE GIMBAL PLATFORM FOR HIGH-RESOLUTION IN SITU CO-PLANARITY ADJUSTMENT

(71) Applicant: Intel Corporation, Santa Clara, CA (US)

(72) Inventors: Paul J. Diglio, Chandler, AZ (US); Joseph F. Walczyk, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 466 days.

(21) Appl. No.: 15/721,331

(22) Filed: Sep. 29, 2017

(65) Prior Publication Data

US 2019/0101570 A1    Apr. 4, 2019

(51) Int. Cl.
*G01R 1/073* (2006.01)
*G01R 31/28* (2006.01)
*G01R 1/04* (2006.01)

(52) U.S. Cl.
CPC .......... *G01R 1/07364* (2013.01); *G01R 1/04* (2013.01); *G01R 1/07342* (2013.01); *G01R 31/2831* (2013.01); *G01R 31/2891* (2013.01)

(58) Field of Classification Search
CPC ............ G01R 1/07364; G01R 31/2891; G01R 31/2831; G01R 1/07342; G01R 1/04
USPC ................................................. 324/750–755
See application file for complete search history.

(56) References Cited

U.S. PATENT DOCUMENTS

| | | | |
|---|---|---|---|
| 5,453,701 A | 9/1995 | Jensen et al. | |
| 5,917,329 A * | 6/1999 | Cadwallader | ...... G01R 31/2886 324/750.25 |
| 2006/0151614 A1 | 7/2006 | Nishizawa et al. | |
| 2007/0126435 A1* | 6/2007 | Eldridge | .......... G01R 31/31905 324/750.22 |
| 2007/0126440 A1* | 6/2007 | Hobbs | ................ G01R 31/2893 324/754.03 |
| 2008/0196474 A1* | 8/2008 | Di Stefano | ........ G01R 31/2891 73/1.01 |
| 2008/0231300 A1* | 9/2008 | Yamada | ............. G01R 31/2891 324/756.03 |
| 2008/0309363 A1 | 12/2008 | Jeon et al. | |
| 2009/0237099 A1 | 9/2009 | Garabedian et al. | |
| 2011/0115513 A1* | 5/2011 | Harada | .............. G01R 31/2891 324/754.08 |
| 2011/0234251 A1* | 9/2011 | Komatsu | ............ G01R 31/2891 324/756.03 |
| 2012/0038383 A1* | 2/2012 | Wu | .................... G01R 31/2887 324/756.01 |
| 2013/0002285 A1 | 1/2013 | Nelson et al. | |
| 2013/0099812 A1 | 4/2013 | Wang et al. | |

(Continued)

*Primary Examiner* — Alvaro E Fortich
*Assistant Examiner* — Zannatul Ferdous
(74) *Attorney, Agent, or Firm* — Green, Howard & Mughal LLP

(57) ABSTRACT

Planar error between a probe card and a semiconductor wafer may be reduced with a low-profile gimbal platform. The low-profile gimbal platform may be coupled between a probe card and a tester head. The low-profiled gimbal platform includes a number of linear actuators and pistons that are used to perform high-precision in situ planarity adjustments to the probe card to achieve co-planarity between the probe card and the semiconductor wafer. The in situ planarity adjustments may reduce the likelihood of malfunctions due to misalignment of the probe card.

16 Claims, 8 Drawing Sheets

(56) References Cited

U.S. PATENT DOCUMENTS

2016/0079635 A1* 3/2016 Niwa ................. G01R 1/06738
  324/426
2017/0219626 A1* 8/2017 Gardell ............. G01R 1/07364

* cited by examiner

LOW-PROFILE GIMBAL PLATFORM FOR HIGH-RESOLUTION IN SITU CO-PLANARITY ADJUSTMENT

TECHNICAL FIELD

The present disclosure relates to systems and methods for improving semiconductor device testing.

BACKGROUND

Equipment malfunctions can occur when one or more components are misaligned. An example of equipment that is susceptible to the misalignment malfunctions is a semiconductor device test system. A type of misalignment that effects semiconductor device test systems is planar misalignment between a device under test (e.g., a die on a semiconductor wafer) and a probe card (or probe needles on a probe card).

This planar misalignment between a device under test and a probe card can cause several types of malfunctions. One example of a malfunction caused by planar misalignment is that a partial touchdown of the probe needles of a probe card can result in a tester system reading false failures for devices under test. Another example of malfunction caused by planar misalignment is that over-compression can result in damage to bonding pads, bent probe needles, or damage to adjacent electronics (when the over-compression results in probe needles extending beyond the area of probe pads). These examples of malfunction introduce error into present testing procedures, and (without a solution) limit the ability to test smaller devices having smaller pad pitches.

In the current state of the art, adjustments for planar error are made by partially disassembling a test system and manually adjusting one or more screws until planar error is reduced for a particular device under test and one particular probe card. Not only is this technique time consuming, it does not account for planar error introduced over time during the test of a wafer, it does not account for planar errors that arise over changes in temperature (during operations), and it relies on the steadiness of a person's hand to set one or more screws to a proper height even though the adjustment demands micrometer precision.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1:
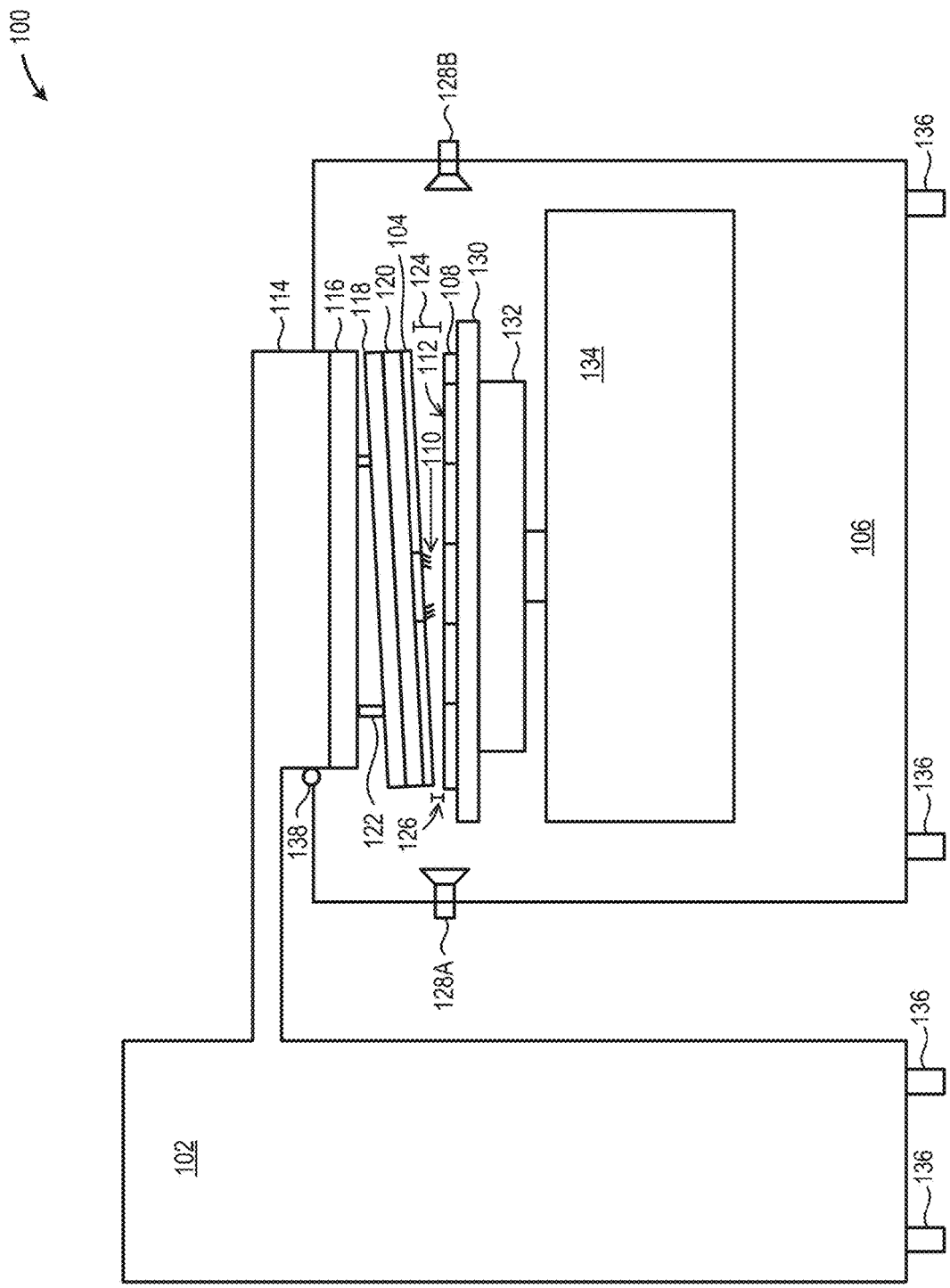
FIG. 1 is a schematic depicting an illustrative probe system in which a low-profile gimbal platform is used to perform in-situ co-planarity adjustments, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

The systems and methods disclosed herein may enable in-situ planarity adjustments to reduce planar error and achieve substantial or tight co-planarity between a probe card and a semiconductor wafer. Among other benefits, in situ planarity adjustments may reduce the likelihood of planarity alignment malfunctions such as under-touchdown and over-compression of probe needles. Additionally, the high-precision techniques disclosed herein may enable the testing (and therefore the manufacture) of smaller devices (semiconductor die).

For die and wafer sort semiconductor testing, high-resolution co-planarity between a probe card and a semiconductor wafer is an important metric to achieve. Co-planarity is achieved by bringing a plane of a surface of a probe card into nearly the same plane as a plane of a surface of the semiconductor wafer being tested by the probe card. Traditionally, probe needles achieve full compression by traveling 50-125 um from initial contact to test-ready ("full compression") contact with a device-under-test ("DUT"). These travel ranges allow for upwards of 35 um co-planarity error (tilt) across a 26 mm×33 mm DUT, without causing substantial damage to the DUT. However, with the scaling down of probe needle pitch, it is estimated and anticipated that the range of probe needle travel to achieve compression will scale down to 10-35 um. Decreased travel ranges for probe needle compression results in reductions in the range of acceptable planar error or tilt tolerance between the probe card and the DUT. Decreased travel ranges for probe needle compression also results in reduced likelihood that manual adjustment will be physically possible. Preliminary tolerance estimates suggest that a maximum planar error of 3-10 um may be the new benchmark to enable the use of short probe needle technologies.

Another achievement of the disclosed low-profile gimbal platform is its withstand force characteristics. The disclosed low-profile gimbal platform supports a withstand force in excess of 10 N/um. Test modules are designed to induce high load concentrations (e.g., less than or equal to 2000 N) to the probe array of probe needles, depending on the probe array size and density. To support both a withstand force that is in excess of 10 N/um and a low profile (e.g., less than 13 mm) that can fit within a probe tooling stack, the low-profile gimbal platform may employ two or more linear actuators that drive two or more corresponding pistons, in nanometer increments, to compensate for micron-resolution planar error.

By contrast, alternative gimbal designs that are currently available are unable to satisfy the demands of present or future high-precision probing. For example, traditional solutions are hampered by low-stiffness (e.g., less than or equal to 4 N/um) and/or are not nearly low-profile enough to fit in a probe tooling stack (e.g., they are equal to or greater than 30 mm thick, whereas the design window height may be <13 mm).

Although the disclosure primarily references reducing planar error between a probe card and a semiconductor wafer, the techniques disclosed herein can be applied to other tools and systems where achieving co-planarity between a semiconductor wafer and a toolset reduces malfunctions, decreases setup or adjustment time, or otherwise improves the performance of the toolset's objectives with regards to a semiconductor wafer or other object.

A low-profile gimbal platform is provided. The low-profile gimbal platform may include a plate having a first surface and a second surface, and a first linear actuator horizontally positioned within the plate between the first surface and the second surface. The first linear actuator may include a first shaft that extends and retracts in parallel with the first surface. The low-profile gimbal platform may include a first piston coupled to the first shaft. The first piston may extend or retract perpendicularly to the first surface, in response to extension or retraction of the first shaft. The low-profile gimbal platform may include a second linear actuator horizontally positioned within the plate between the first surface and the second surface. The second linear actuator may include a second shaft that extends and retracts in parallel with the first surface. The low-profile gimbal platform may include a second piston coupled to the second shaft. The second piston may extend or retract perpendicularly to the first surface, in response to extension or retraction of the second shaft.

A semiconductor device testing system is provided. The semiconductor device testing system may include a tester system. The tester system may include a test computing system that acquires information about one or more devices under test; and a tester head physically and electrically coupled between a probe card and the test computing system to transfer the information from the one or more devices under test to the test computing system. The semiconductor device testing system may include a low-profile gimbal platform mechanically coupled between the probe card and the tester head to align a plane of the probe card with a plane of a semiconductor wafer of the one or more devices under test. The low-profile gimbal platform may include a plate having a first surface and a second surface and a first linear actuator horizontally positioned within the plate between the first surface and the second surface. The first linear actuator may include a first shaft that extends and retracts in parallel with the first surface. The low-profile gimbal platform may include a first piston coupled to the first shaft. The first piston may extend or retract perpendicularly to the first surface, in response to extension or retraction of the first shaft. The low-profile gimbal platform may include a second linear actuator horizontally positioned within the plate between the first surface and the second surface. The second linear actuator may include a second shaft that extends and retracts in parallel with the first surface. The low-profile gimbal platform may include a second piston coupled to the second shaft. The second piston may extend or retract perpendicularly to the first surface, in response to extension or retraction of the second shaft.

A method of operating a low-profile gimbal platform to reduce planar error is provided. The method may include measuring, by a tester system, planar error between a probe card and a semiconductor wafer of one or more devices under test; determining, by the tester system, which one or more of a plurality of linear actuators in a low-profile gimbal platform to operate to reduce the planar error; and transmitting instructions to the low-profile gimbal platform to operate one or more of the plurality of linear actuators to reduce the planar error.

As used herein the term planar error refers to a length difference between a minimum distance from a probe card surface to a semiconductor wafer surface and a maximum distance between the same probe card surface and the semiconductor wafer surface, measured normal (i.e., at 90 degrees) to the semiconductor wafer. The planar error may also be measured from probe needle tips of probe needles of a probe array of a probe card. In other words, length difference between a minimum distance from tips of probe needles in a probe array to a semiconductor wafer surface and a maximum distance from the same tips of probe needles in a probe array to the semiconductor wafer surface, measured perpendicularly (i.e., at 90 degrees) to the semiconductor wafer, and measured from a single array of probe needles of a probe card.

FIG. 1 depicts an illustrative probe system 100 in which a low-profile gimbal platform is used to perform in situ co-planarity adjustments, in accordance with at least one embodiment described herein. In situ co-planarity adjustments are co-planarity adjustments that are made while the probe system 100 is in position for operation (as opposed to partially or fully disassembled). The probe system 100 includes a tester system 102 and a wafer or die handler 106 for suspending, operating, and in situ aligning a probe card 104, in accordance with at least one embodiment. The probe system 100 uses the wafer or die handler 106 for selectively maneuvering a semiconductor wafer or die 108 and for engaging the semiconductor wafer or die 108 with a probe array of probe needles 110 that are carried by the probe card 104, in accordance with at least one embodiment described herein. A die is a singulated portion of a wafer.

The tester system 102 may acquire characteristics of semiconductor dice (e.g., semiconductor die 112) that constitute the semiconductor wafer or die 108 or portions singulated from the semiconductor wafer or die 108, in accordance with at least one embodiment described herein. The tester system 102 may transmit electrical signals (e.g., AC and DC voltages) to the semiconductor dice of the semiconductor wafer or die 108, and may receive and acquire information that is representative of characteristics of the semiconductor dice. By acquiring information that is representative of characteristics of the semiconductor dice, the tester system 102 may sort or test, for example, low-performance dice from mid-performance dice from high-performance dice in the semiconductor wafer or die 108. Sorting/testing the dice enables the manufacturer to separate and sell (or not sell) the semiconductor dice at different prices, based on the performance of the dice.

The tester system 102 includes a tester head 114 that may physically and electrically couple with various interfaces and tools to support the acquisition of information from the semiconductor wafer or die 108 through the probe card 104, in accordance with at least one embodiment described herein. The tester head 114 may be coupled to a head interface 116, which may be coupled to a low-profile gimbal platform 118, which may be coupled to a tool interface 120, which may be couple to and may carry the probe card 104, in accordance with at least one embodiment described herein. The head interface 116 may provide mechanical and electrical connections to probe tools and tool interfaces, in accordance with at least one embodiment described herein. The head interface 116 may also function as a gimbal support plate to which the low-profile gimbal platform 118 attaches to and presses against, to reduce planar error and/or to achieve co-planarity between the probe card 104 and the semiconductor wafer or die 108, in accordance with at least one embodiment described herein.

The tool interface 120 provides an electrical and/or physical coupling or interface between the low-profile gimbal platform 118 and the probe card 104, in accordance with at least one embodiment described herein. The tool interface 120 is depicted as carrying a probe card 104, however, the tool interface 120 may interface with and carry various other types of tools (e.g., fuse blowing laser) to measure, modify, or test the semiconductor dice of the semiconductor wafer or die 108, in accordance with at least one embodiment described herein.

The low-profile gimbal platform 118 is disposed between the tester head 114 and the probe card 104, to provide in situ high-resolution co-planarity adjustments, in accordance with at least one embodiment described herein. The low-profile gimbal platform 118 operates one or more pistons 122 to adjust the co-planarity between the plane of the probe card 104 and the plane of the semiconductor wafer or die 108, in accordance with at least one embodiment described herein. The low-profile gimbal platform 118 may operate one or more pistons 122 to reduce the planar error between the plane of the probe card 104 and the plane of the semiconductor wafer or die 108, in accordance with at least one embodiment described herein. The planar error between the plane of the probe card 104 and the plane of the semiconductor wafer or die 108 is the difference between a maximum distance 124 and a minimum distance 126 between a surface of the probe card 104 and surface of the semiconductor wafer or die 108, in accordance with at least one embodiment described herein. In one embodiment, the maximum distance 124 and the minimum distance 126 are measured between the probe array of probe needles 110 and a surface of the semiconductor wafer or die 108.

The tester system 102 operates the low-profile gimbal platform 118 in response to determining the maximum distance 124 and the minimum distance 126, in accordance with at least one embodiment disclosed herein. The tester system 102 uses an optical device 128A and an optical device 128B (collectively, optical devices 128) to measure the maximum distance 124 and the minimum distance 126, in accordance with at least one embodiment described herein. The optical devices 128 include one or more of a camera, a laser, a light emitting diode, and a light sensor, in accordance with various embodiments disclosed herein. Although two optical devices 128 are depicted, three, four, or more optical devices may be used by the tester system 102 to measure planar error and verify co-planarity between the probe card 104 and the semiconductor wafer or die 108, in accordance with at least one embodiment disclosed herein.

The wafer or die handler 106 positions the semiconductor wafer or die 108 under the probe card 104 and selectively causes the semiconductor dice (e.g., semiconductor die 112) to make contact with the probe array of probe needles 110, to enable the tester system 102 to test and/or modify the semiconductor dice of the semiconductor wafer or die 108, in accordance with at least one embodiment described herein. The wafer or die handler 106 carries the semiconductor wafer or die 108 on a thermal plate 130, which establishes a temperature for the semiconductor wafer or die 108 during operation of the tester system 102. The wafer or die handler 106 also includes a chuck 132 and a chuck positioner 134 that selectively positions the semiconductor wafer or die 108 in an x-axis, y-axis, and z-axis, with respect to the probe array of probe needles 110, to facilitate testing and modification of the semiconductor dice of the semiconductor wafer or die 108, in accordance with at least one embodiment described herein.

The probe system 100 illustrates various potential sources of planar error that may contribute to planar error by misaligning the co-planarity of the probe card 104 and the semiconductor wafer or die 108, in accordance with at least one embodiment described herein. Examples of potential sources of planar error include, but are not limited to, the mechanical/electrical coupling (e.g., metal and/or plastic connectors) between the tester head 114 and the head interface 116, the mechanical/electrical coupling (e.g., metal and/or plastic connectors) between the low-profile gimbal platform 118 and the tool interface 120, the mechanical/electrical coupling (e.g., metal and/or plastic connectors) between the tool interface 120 and the probe card 104, mismatched height of one or more feet 136, and imprecision in the construction or operation of the hinge 138 for the tester head 114 on the wafer or die handler 106, in accordance with at least one embodiment described herein. Advantageously, this non-exhaustive list of potential sources of planar error may all cumulatively be remediated while the probe system 100 is in its operative configuration (i.e., in situ) through the use of the low-profile gimbal platform 118, in accordance with at least one embodiment described herein.

The tester system 102 is one example of probe tooling that benefits from in situ alignment of the probe card 104, in accordance with at least one embodiment described herein. However, it is noted that other probe tooling or other testing, manufacturing, or monitoring equipment that relies on high-precision co-planarity may equally benefit from the herein disclosed embodiments of the low-profile gimbal platform 118.

Figure 2:
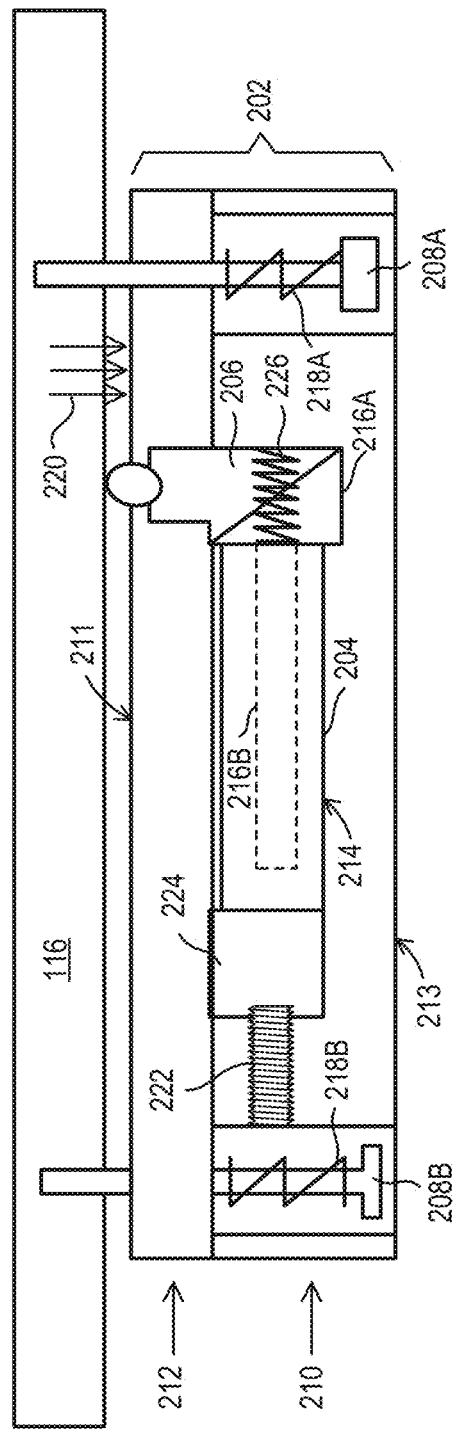
FIG. 2 is a schematic depicting an illustrative configuration of a low-profile gimbal platform, in accordance with at least one embodiment described herein.

FIG. 2 depicts a side view of an illustrative low-profile gimbal platform 200 as one example implementation of the low-profile gimbal platform 118 (shown in FIG. 1), in accordance with at least one embodiment described herein. The low-profile gimbal platform 200 includes a plate 202, a linear actuator 204, a piston 206, and retention devices 208 (individually, 208A and 208B), to facilitate performing in situ co-planarity adjustments, in accordance with at least one embodiment described herein.

The plate 202 may be a metal plate that is bored out with openings to enable the plate 202 to the house or includes the various components of the low-profile gimbal platform 200, in accordance with at least one embodiment described herein. The plate 202 is aluminum, brass, copper, steel, or other material that satisfies stiffness demands of the system. The plate 202 includes a body 210 and an enclosure 212 that is attached to the body 210 to enclose the various components of the low-profile gimbal platform 200, in accordance with at least one embodiment described herein. The plate 202 may include a first surface 211 and a second surface 213. The first surface 211 may be flat or substantially flat. The second surface 213 may be flat, maybe concave, maybe convex, or may be some other non-flat shape, in accordance with at least one embodiment described herein.

The linear actuator 204 may be one of a number of linear actuators used by the low-profile gimbal platform 200, to perform in situ co-planarity adjustments. In accordance with various embodiments/implementations, the low-profile gimbal platform 200 includes two linear actuators, three linear actuators, or more than three linear actuators, which are selectively operated to reduce the planar error between a probe card and a semiconductor wafer. The linear actuator 204 is one or more of a piezoelectric actuator, a hydraulic actuator, a mechanical actuator, a pneumatic actuator, and an electro-mechanical actuator, in accordance with at least one embodiment described herein. The linear actuator 204 includes a housing 214, and an outer shaft 216A and an inner shaft 216B (collectively, a shaft 216), in accordance with at least one embodiment described herein. When operated, the inner shaft 216B extends from the housing 214 and causes the outer shaft 216A to extend away from the housing 214. The outer shaft 216A extending away from the housing 214 may cause the piston 206 to extend perpendicularly from the first surface 211 of the low-profile gimbal platform 200, in accordance with at least one embodiment described herein. The outer shaft 216A may have a body that is sloped away from the housing 214 and that slidably couples or mates with a sloped surface of the piston 206, to actuate the piston 206, in accordance with at least one embodiment described herein.

The piston 206 is configured to extend and retract perpendicularly to the first surface 211 of the low-profile gimbal platform 200, to selectively increase and decrease distance between the first surface 211 and the head interface 116, in accordance with at least one embodiment described herein. The piston 206 is cylindrical or is a polyhedron and includes a sloped surface that slopes away from the housing 214 of the linear actuator 204, to slidably couple or mate with the outer shaft 216A, in accordance with at least one embodiment described herein. The piston 206 may be a means for applying force perpendicularly from the first surface 211, in accordance with at least one embodiment described herein.

The retention devices 208 are two of a number of retention devices that maintain contact (e.g., with spring tension force) between the plate 202 and the head interface 116, in accordance with at least one embodiment described herein. The retention devices 208 are anchored in the body 210 of the plate 202, and the retention devices 202 are anchored in the head interface 116, in accordance with at least one embodiment described herein. The retention devices 208 are anchored in the plate 202 by the enclosure 212, and the retention devices 202 are anchored in the head interface 116, in accordance with at least one embodiment described herein. The retention devices 208 are pins or shafts that are encompassed or partially enclosed by springs 218 (individually, spring 218A and spring 218B), in accordance with at least one embodiment described herein. The retention devices 208 may provide a tension force 220 that causes the piston 206 to retract when the linear actuator 204 is not an operation. The retention devices 208 also provide the tension force 220 that causes the shaft 216B to retract into the housing 214, when the linear actuator 204 is not in operation, in accordance with at least one embodiment described herein.

The initial height of the piston 206 is set, with respect to the first surface 211, using a set screw 222 and an adjustment block 224, in accordance with at least one embodiment described herein. The set screw 222 is manually operated to laterally adjust a position of the housing 214 and the outer shaft 216A of the actuator 204, in accordance with the lease one embodiment described herein. A spring 226 causes the actuator 204 to maintain contact (e.g., with compression force) against the set screw 222, when the set screw is backed away from the actuator 204, in accordance with at least one embodiment described herein. The adjustment block 224 enables a user to secure the position of the linear actuator 204 within the plate 202, so that the set screw 222 is not the sole mechanism for maintaining the lateral position of the linear actuator 204 within the plate 202, in accordance with at least one embodiment described herein.

Figure 3:
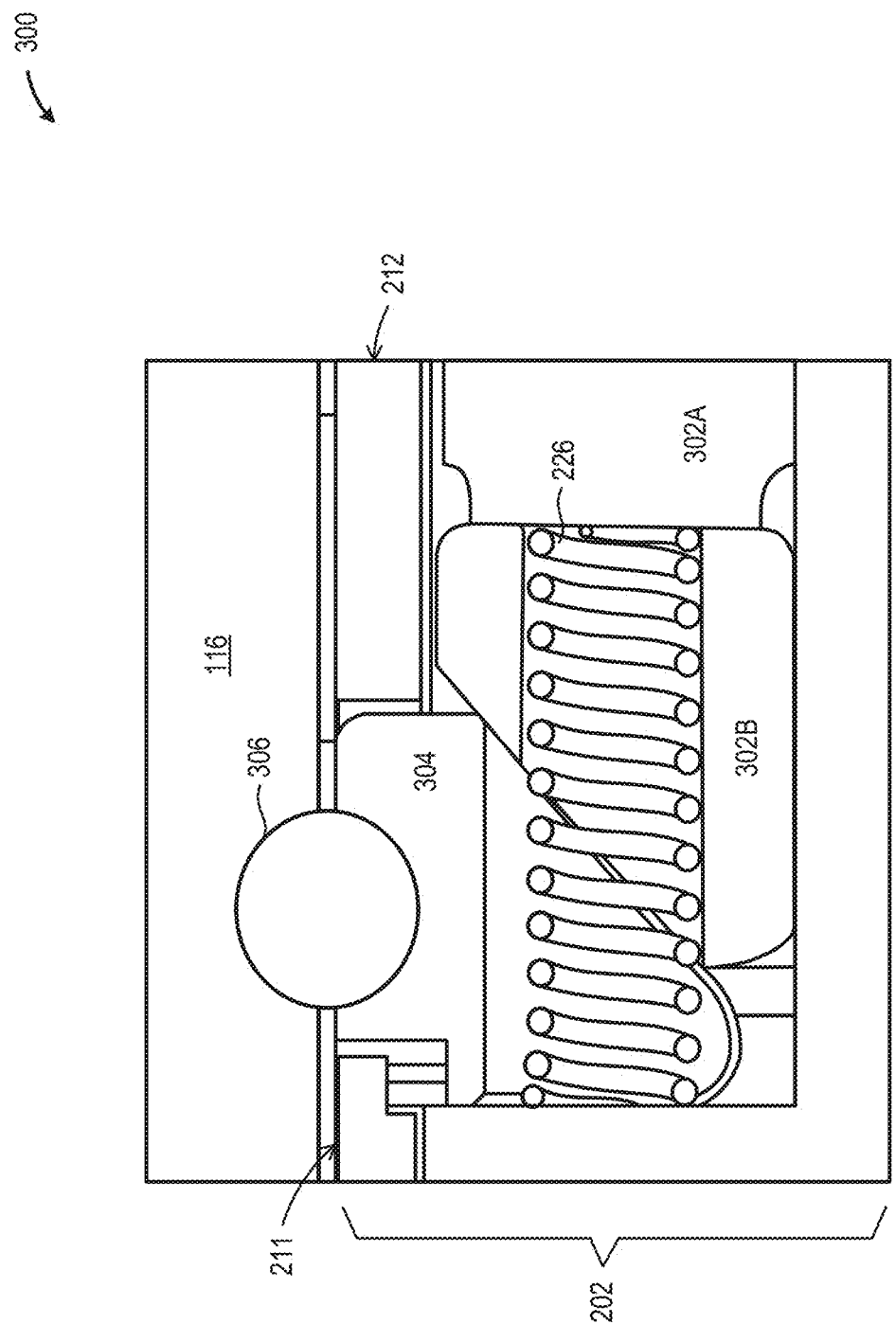
FIG. 3 is a schematic depicting an illustrative piston mechanism as a portion of the low-profile gimbal platform, in accordance with at least one embodiment described herein.

FIG. 3 depicts a side view of an illustrative piston mechanism 300 as a portion of the low-profile gimbal platform 200 (shown in FIG. 2), in accordance with at least one embodiment described herein. The piston mechanism 300 includes an inner shaft 302A (one implementation of the inner shaft 216B of FIG. 2), an outer shaft 302B (one implementation of the outer shaft 216A of FIG. 2) (collectively, the shaft 302), and a piston 304 (one implementation of the piston 206 of FIG. 2), in accordance with at least one embodiment described herein. The inner shaft 302A extends and retracts in an out of a housing of a linear actuator, causing the outer shaft 302B to slidably extend and retract from the first surface 211 of the plate 202, in accordance with at least one embodiment described herein. The outer shaft 302B may be cylindrical or may be a polyhedron and is partially sloped away from the inner shaft 302A, causing the outer shaft 302B to slidably couple with and slidably operate the piston 304, in accordance with at least one embodiment described herein. The piston 304 may be cylindrical or may be a polyhedron that is at least partially sloped to approximately match the slope of the outer shaft 302B, to enable the piston 304 to be operated by the extension and retraction of the outer shaft 302B, in accordance with at least one embodiment described herein.

The piston 304 includes a termination 306, which engages with and applies force against the head interface 116, in accordance with at least one embodiment described herein. The termination 306 is at least one of a bearing, a rounded surface, a pin, a polyhedron, and a cylinder, in accordance with at least one embodiment described herein.

Figure 4:
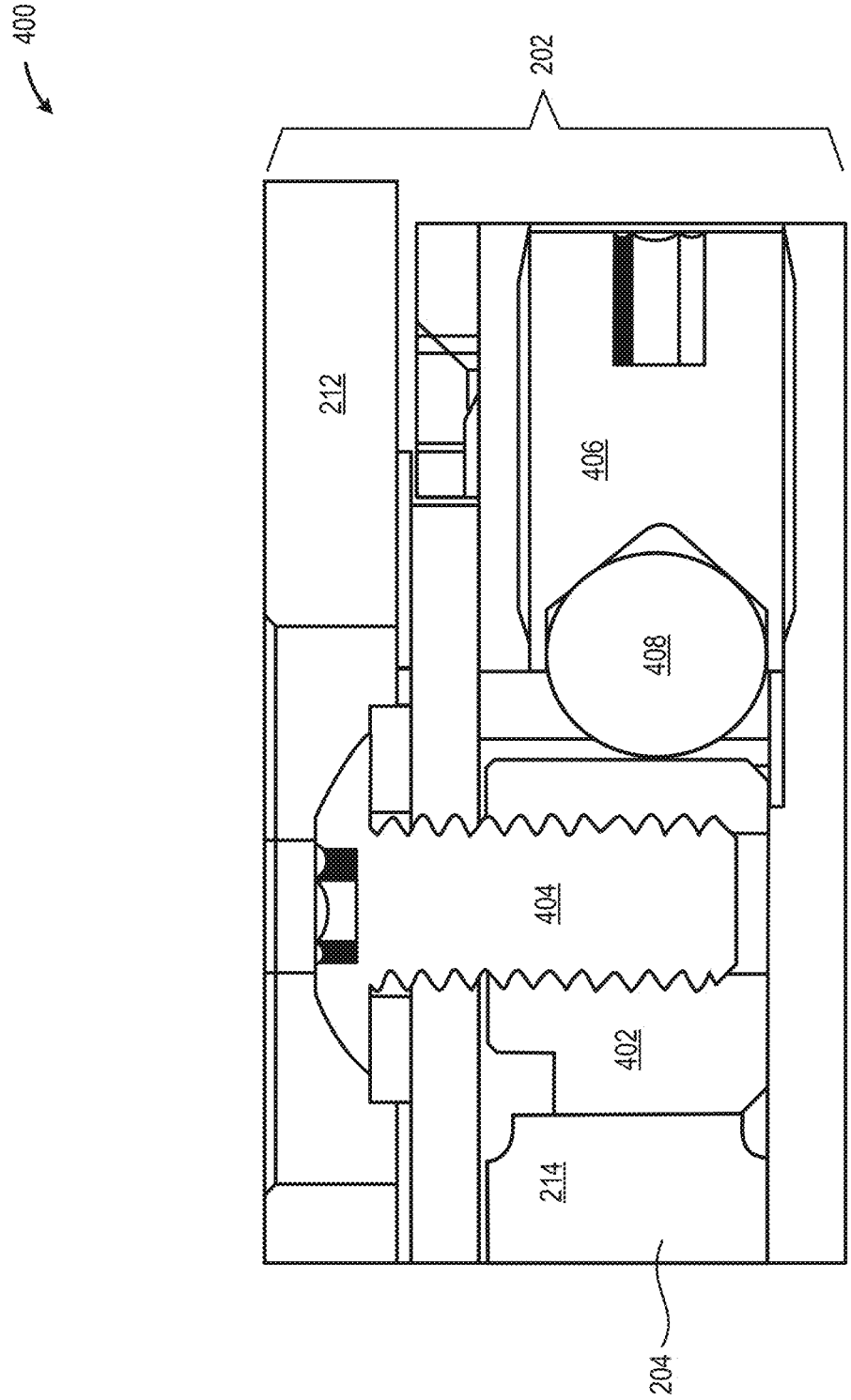
FIG. 4 is a schematic depicting an illustrative configuration of an adjustment block for a linear actuator in a low-profile gimbal platform, in accordance with at least one embodiment described herein.

FIG. 4 depicts a side view of an illustrative configuration of an adjustment block 400 as the portion of the low-profile gimbal platform 200 (shown in FIG. 2), in accordance with at least one embodiment described herein. The adjustment block 400 includes a block 402, a locking screw 404, and a set screw 406, in accordance with at least one embodiment described herein. The block 402 is one implementation of the adjustment block 224 (shown in FIG. 2), in accordance with at least one it embodiment described herein. The set screw 406 is one implementation of the set screw 222 (shown in FIG. 2), in accordance with at least one embodiment described herein. The locking screw 404 causes the block 402 and the housing 214 to maintain a position within the plate 202, in accordance with at least one embodiment described herein. The set screw 406 may be terminated with a ball bearing 408 to increase the likelihood of performing precise lateral adjustments of the linear actuator 204, in accordance with at least one embodiment described herein.

Figure 5:
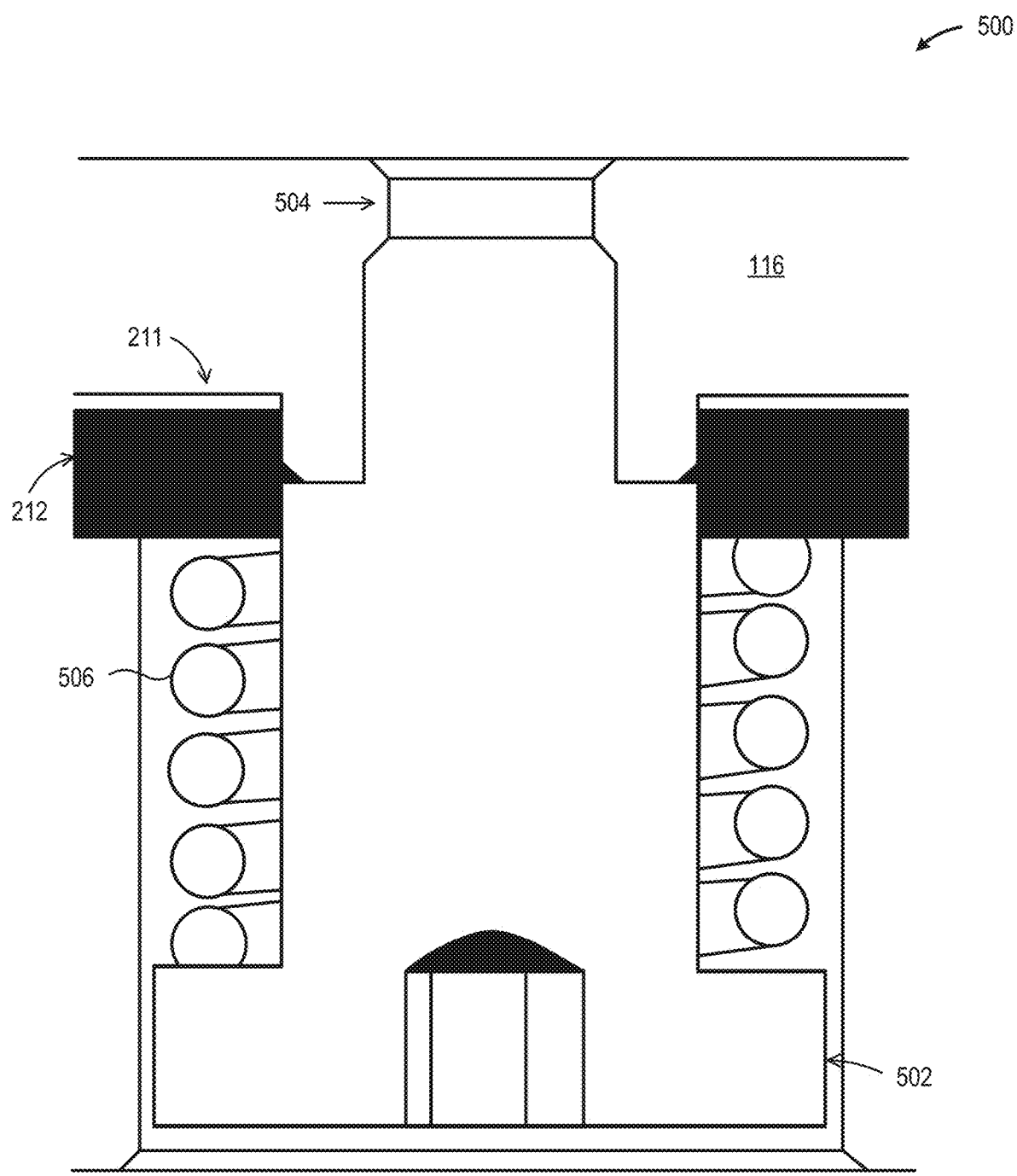
FIG. 5 is a schematic depicting an illustrative configuration of a retention device for use in a low-profile gimbal platform, in accordance with at least one embodiment described herein.

FIG. 5 depicts a side view of an illustrative configuration of a retention device 500 as a portion of the low-profile gimbal platform 200 (shown in FIG. 2), in accordance with at least one embodiment described herein. The retention device 500 is one implementation of the retention devices 208 (shown in FIG. 2), in accordance with at least one embodiment described herein. The retention device 500 includes a first anchor end 502, a second anchor end 504, and a spring 506, in accordance with at least one embodiment described herein. The first anchor end 502 anchors the retention device 500 to the body 210 of the plate 202 (both shown in FIG. 2), in accordance with at least one embodiment described herein. The second anchor end 504 anchors the retention device 500 to the head interface 116, in accordance with at least one implementation described herein. The spring 506 applies a tension force on the head interface 116 to maintain contact between the head interface 116 and the pistons of the low-profile gimbal platform, in accordance with at least one embodiment described herein.

Figure 6:
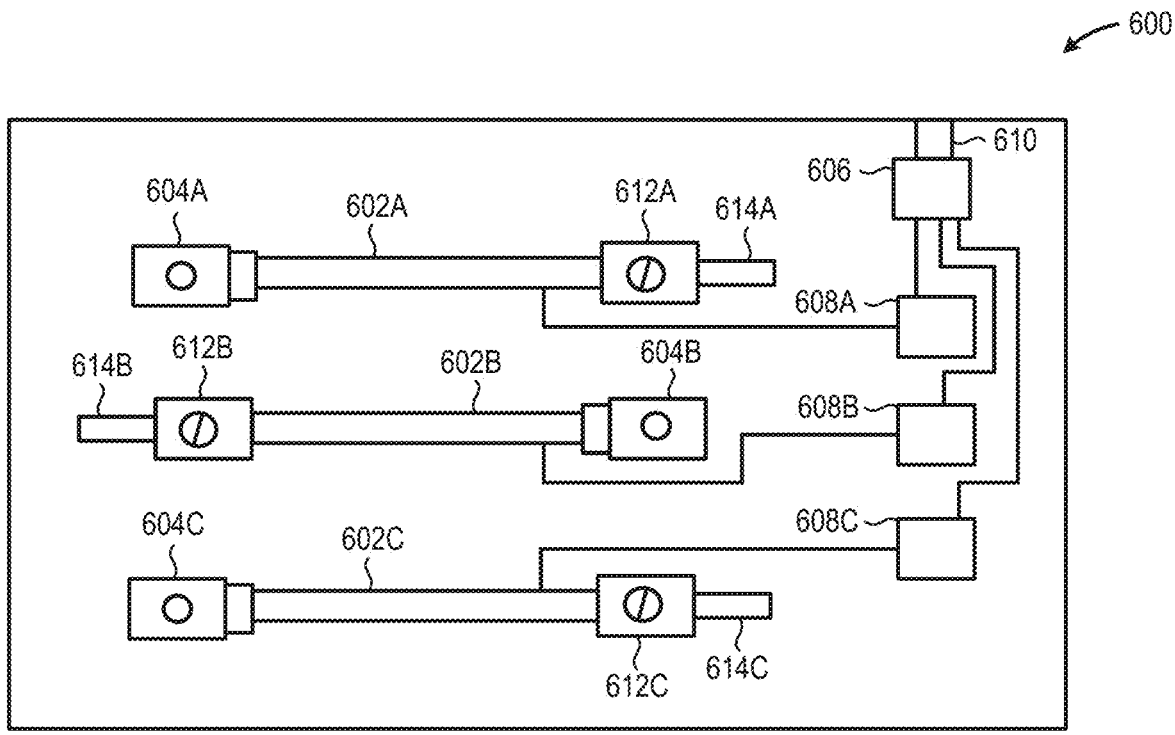
FIG. 6 is a schematic depicting an illustrative configuration of multiple linear actuators in a low-profile gimbal platform, in accordance with at least one embodiment described herein.

FIG. 6 depicts a top view of an illustrative actuator control system 600 for controlling multiple linear actuators in a low-profile gimbal platform, in accordance with at least one embodiment described herein. The actuator control system 600 includes a linear actuator 602A, a linear actuator 602B, and a linear actuator 602C (cumulatively, linear actuators 602), a piston 604A, a piston 604B, and a piston 604C (cumulatively, pistons 604, an actuator controller 606, and an amplifier 608A, an amplifier 608B, and an amplifier 608C (cumulatively, amplifiers 608), in accordance with at least one embodiment described herein. The actuator controller 606 receives commands for operating one or more of the linear actuators 602 from the tester system 102 through, for example, a communications port 610, in accordance with at least one embodiment described herein. The communications port 610 is a micro USB port, a mini USB port, or some other communications port, in accordance with at least one embodiment described herein. The actuator controller 606 selectively operates the linear actuators 602 by transmitting one or more voltage levels to the amplifiers 608 that cause the linear actuators 602 to operate one or more of the pistons 604, in accordance with at least one embodiment described herein.

The actuator control system 600 also illustrates an adjustment block 612A, an adjustment block 612B, and an adjustment block 612C (cumulatively, adjustment blocks 612) and a set screw 614A, a set screw 614B, and a set screw 614C (cumulatively, set screws 614), as part of a top view of an example configuration of the linear actuators 602 in a low-profile gimbal platform for reducing planar error in a probe system, in accordance with at least one embodiment described herein.

Figure 7:
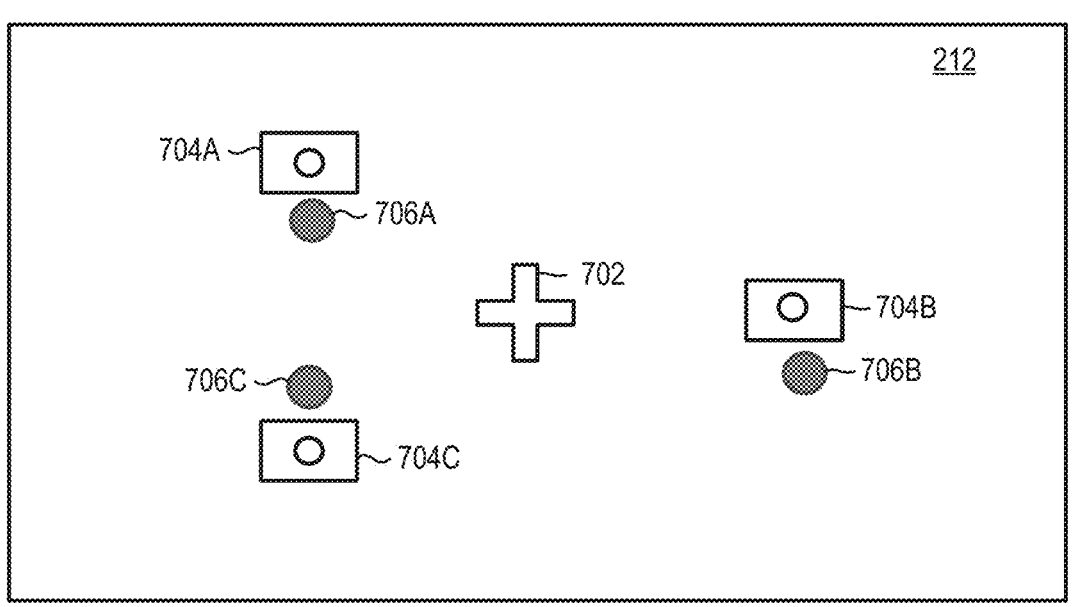
FIG. 7 is a schematic depicting an illustrative configuration of pistons and retention devices in a low-profile gimbal platform, in accordance with at least one embodiment described herein.

FIG. 7 depicts a top view of an illustrative configuration 700 of pistons and retention devices in a low-profile gimbal platform, in accordance with at least one embodiment described herein. The configuration 700 includes a center location 702 of the enclosure 212, a piston 704A, a piston 704B, and a piston 704C (cumulatively, pistons 704), and a retention device shaft 706A, a retention device shaft 706B, and a retention device shaft 706C (cumulatively, retention device shafts 706), in accordance with at least one embodiment described herein. The pistons 704 may be distributed around the center location 702 of the enclosure 212. Distributing the pistons 704 around the center location 702 enables selective operation of the piston 704 to reduce the planar error of a probe card that is misaligned at any angle, in accordance with at least one embodiment described herein. In one implementation, the pistons 704 are equidistantly distributed around the center location 702 of the enclosure 212. The retention device shafts 706 represent locations of retention devices that apply tensile force between the low-profile gimbal platform 118 and the head interface 116 (both shown in FIG. 1), in accordance with at least one embodiment described herein. The retention device shafts 706 are positioned proximate to the pistons 704 to facilitate retraction of the pistons 704 into the enclosure 212, which also causes the retraction of the shafts of the corresponding linear actuators, in accordance with at least one embodiment described herein.

Figure 8:
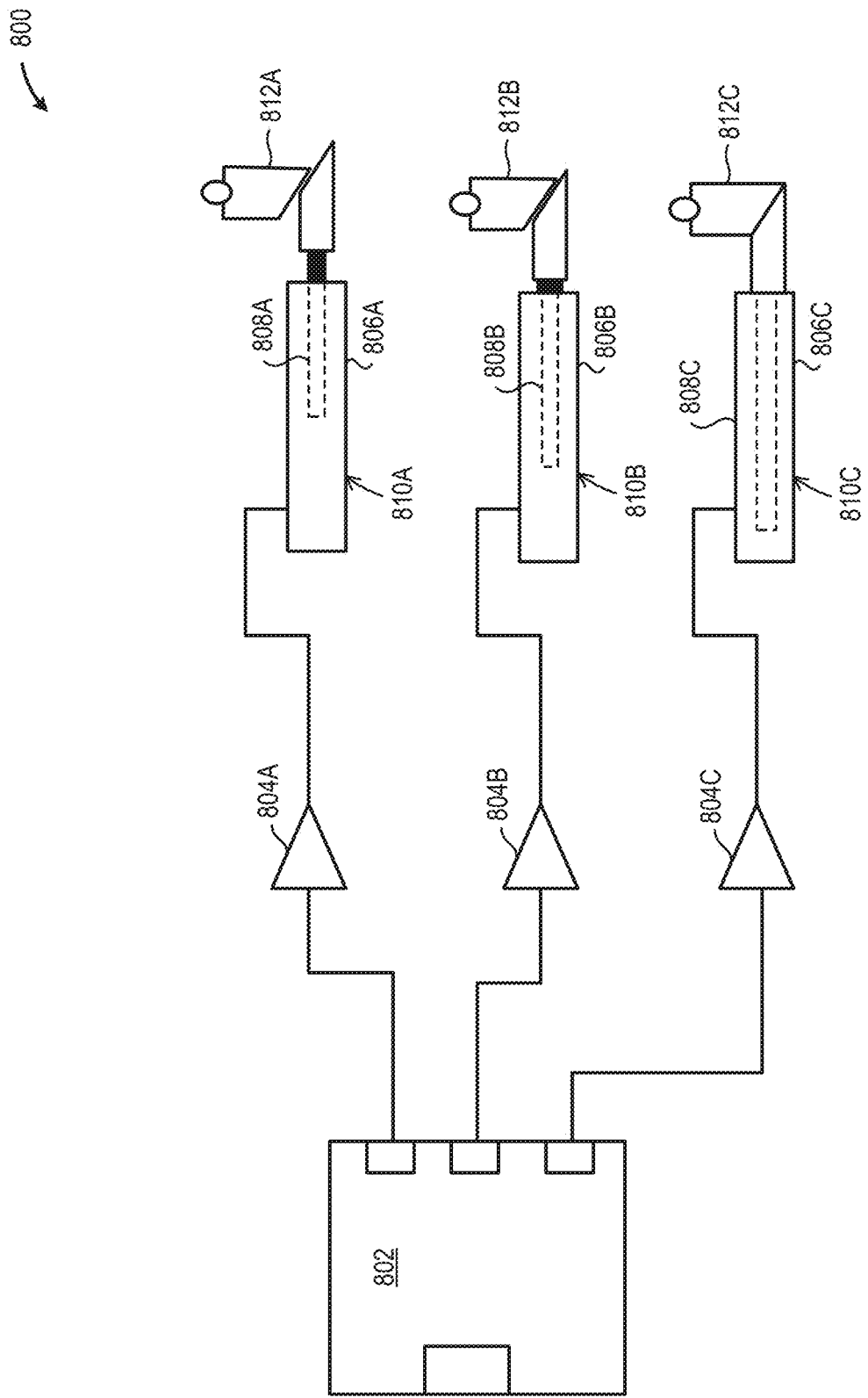
FIG. 8 is a schematic depicting an illustrative system of linear actuators operating pistons that may be used in a low-profile gimbal platform, in accordance with at least one embodiment described herein.

FIG. 8 depicts an illustrative actuator control system 800 of linear actuators and pistons in varying positions of operation, in accordance with at least one embodiment described herein. The actuator control system 800 includes an actuator controller 802, an amplifier 804A, an amplifier 804B, an amplifier 804C (cumulatively, amplifiers 804), a linear actuator 806A, a linear actuator 806B, and a linear actuator 806C (cumulatively, linear actuators 806), and illustrates the actuators 806 at different stages operation, in accordance with at least one embodiment described herein. When the accumulators 806 are implemented with piezoelectric linear actuators, the shafts 808 (individually, shaft 808A, shaft 808B, and shaft 808C) extend from the housings 810 (individually, housing 810A, housing 810B, and housing 810C) of the linear actuators 806, in response to the quantity of voltage applied by the actuator controller 802 through the amplifiers 804. As shown, the further the shafts 808 extend from housings 810, the further the pistons 812 extend perpendicularly from the linear actuators 806, in accordance with at least one embodiment described herein.

Figure 9:
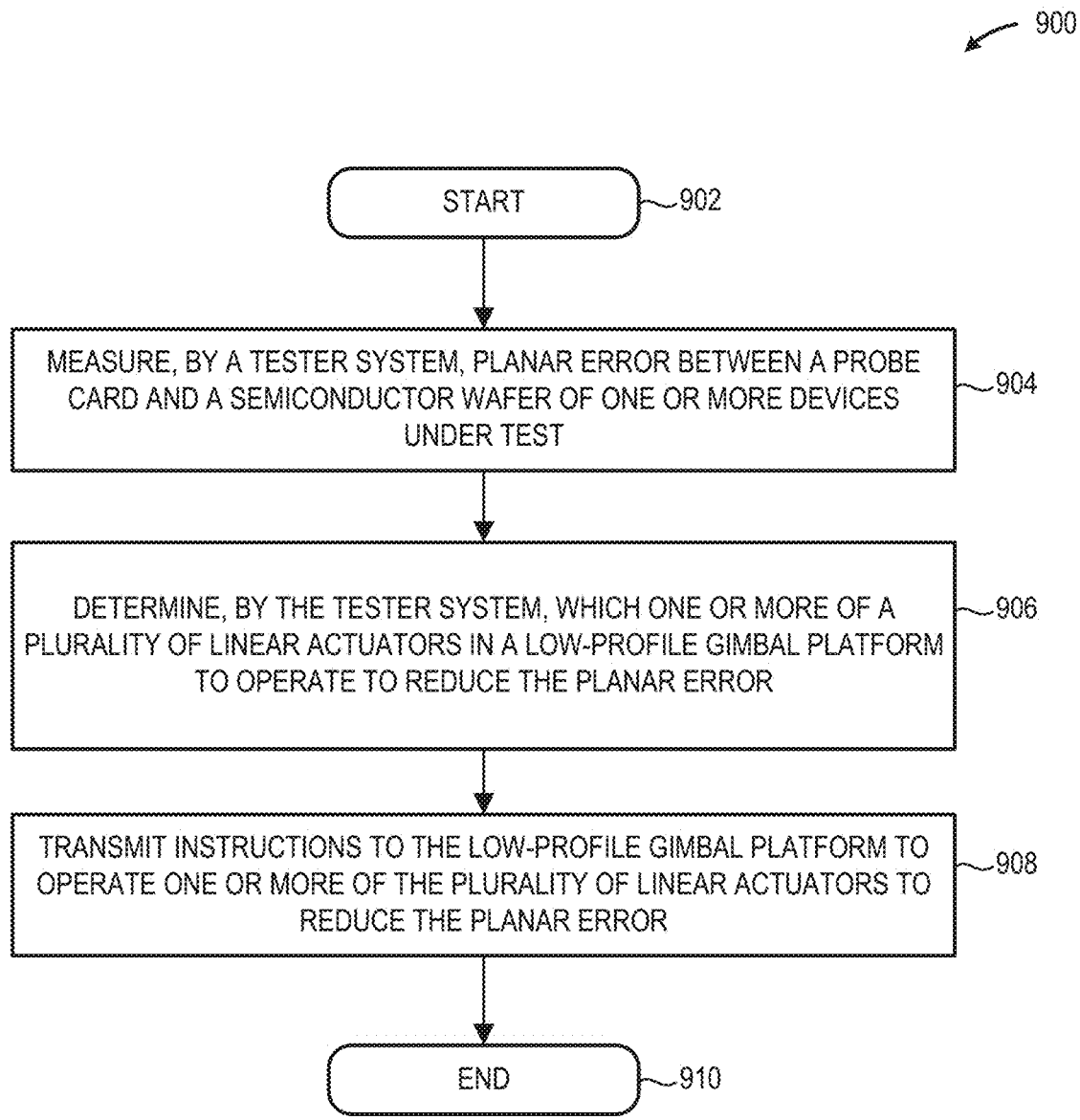
FIG. 9 is a high-level logic flow diagram of an illustrative method of operating a low-profile gimbal platform to reduce planar error, in accordance with at least one embodiment described herein.

FIG. 9 is a high-level logic flow diagram of an illustrative method 900 of operating a low-profile gimbal platform to reduce planar error, in accordance with at least one embodiment described herein. The method 900 commences at 902.

At 904, the tester system 102 (shown in FIG. 1) measures planar error between a probe card and a semiconductor wafer of one or more devices under test, in accordance with at least one embodiment described herein. The tester system uses one or more cameras to measure the planar error, in accordance with at least one embodiment described herein.

At 906, the tester system 102 (shown in FIG. 1) determines which one or more of a plurality of linear actuators in a low-profile gimbal platform to operate to reduce the planar error, in accordance with at least one embodiment described herein.

At 908, the tester system 102 (show in FIG. 1) transmits instructions to the low-profile gimbal platform to operate one or more of the plurality of linear actuators to reduce the planar error, in accordance with at least one embodiment described herein. The method 900 concludes at 910.

Additionally, operations for the embodiments have been further described with reference to the above figures and accompanying examples. Some of the figures may include a logic flow. Although such figures presented herein may include a particular logic flow, it can be appreciated that the logic flow merely provides an example of how the general functionality described herein can be implemented. Further, the given logic flow does not necessarily have to be executed in the order presented unless otherwise indicated. The embodiments are not limited to this context.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. Thus, the breadth and scope of the present invention should not be limited by any of the above-described exemplary embodiments, but should be defined only in accordance with the following claims and their equivalents.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

Reference throughout this specification to "one embodiment", "an embodiment", or "an implementation" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The following examples pertain to further embodiments. The following examples of the present disclosure may comprise subject material such as at least one device, a method, at least one machine-readable medium for storing instructions that when executed cause a machine to perform acts based on the method, and/or a system for providing a low-profile gimbal platform.

According to example 1, there is provided a low-profile gimbal platform. The low profile gimbal platform may include a plate having a first surface and a second surface; a first linear actuator horizontally positioned within the plate between the first surface and the second surface, wherein the first linear actuator includes a first shaft that extends and retracts in parallel with the first surface; a first piston coupled to the first shaft, wherein the first piston extends or retracts perpendicularly to the first surface, in response to extension or retraction of the first shaft; a second linear actuator horizontally positioned within the plate between the first surface and the second surface, wherein the second linear actuator includes a second shaft that extends and retracts in parallel with the first surface; and a second piston coupled to the second shaft, wherein the second piston extends or retracts perpendicularly to the first surface, in response to extension or retraction of the second shaft.

Example 2 may include the elements of example 1 where a thickness of the plate is less than or equal to 13 millimeters.

Example 3 may include the elements of example 1 where one or more of the first linear actuator and the second linear actuator are a piezoelectric actuator.

Example 4 may include the elements of example 1 where one or more of the first linear actuator and the second linear actuator are a hydraulic actuator.

Example 5 may include the elements of example 1 where one or more of the first linear actuator and the second linear actuator are a mechanical actuator.

Example 6 may include the elements of example 1 where one or more of the first linear actuator and the second linear actuator are a pneumatic actuator.

Example 7 may include the elements of example 1 where one or more of the first linear actuator and the second linear actuator are an electro-mechanical actuator.

Example 8 may include the elements of example 1 where one or more of the first linear actuator and the second linear actuator operate in response to receipt of one or more electrical signals received from a tester system.

Example 9 may include the elements of example 1 where the first shaft is at least partially sloped away from a first housing of the first actuator to slidably mate with the first piston, to cause the first piston to extend perpendicularly from the first surface if the first shaft extends from the first housing.

Example 10 may include the elements of example 1 where the second shaft is at least partially sloped away from a second housing of the second actuator to slidably mate with the second piston, to cause the second piston to extend perpendicularly from the second surface if the second shaft extends from the second housing.

Example 11 may include the elements of example 1 where the first piston is hydraulically extended by extension of the first shaft and the second piston is hydraulically extended by extension of the second shaft.

Example 12 may include the elements of example 1 where a distal end of the first piston includes a first termination that is one of a ball bearing, a rounded surface, a pin, a polyhedron, and a cylinder.

Example 13 may include the elements of example 1 where a distal end of the first piston includes a first termination that is a ball bearing.

Example 14 may include the elements of example 1 where a distal end of the first piston includes a first termination that is a rounded surface.

Example 15 may include the elements of example 1 where a distal end of the first piston includes a first termination that is a pin.

Example 16 may include the elements of example 1 where a distal end of the first piston includes a first termination that is a polyhedron.

Example 17 may include the elements of example 1 where a distal end of the first piston includes a first termination that is a cylinder.

Example 18 may include the elements of example 1, in addition to a third linear actuator horizontally positioned within the plate between the first surface and the second surface, wherein the third linear actuator includes a third shaft that extends and retracts in parallel with the first surface; and a third piston coupled to the third shaft, wherein the third piston extends or retracts perpendicularly to the first surface, in response to extension or retraction of the third shaft.

Example 19 may include the elements of example 1, in addition to at least two retention pins, wherein the at least two retention pins are anchored in the plate and extend from the first surface to anchor to a gimbal support plate; and at least two springs mounted around each of the at least two retention pins, to compress the gimbal support plate towards the first surface of the plate.

Example 20 may include the elements of example 1, in addition to a first set screw that adjusts a horizontal position of the first actuator within the plate, to adjust an initial height of the first piston relative to the first surface; a first adjustment block positioned between the first set screw and the first actuator that fixes the horizontal position of the first actuator within the plate; and a first adjustment block screw mated to the first adjustment block to selectively fix the first adjustment block within the plate.

Example 21 may include the elements of example 20, in addition to a second set screw that adjusts a horizontal position of the second actuator within the plate, to adjust an initial height of the second piston relative to the first surface; a second adjustment block positioned between the second set screw and the second actuator that fixes the horizontal position of the second actuator within the plate; a second adjustment block screw mated to the second adjustment block to selectively fix the second adjustment block within the plate; a third set screw that adjusts a horizontal position of a third actuator within the plate, to adjust a default height of a third piston relative to the first surface; a third adjustment block positioned between the third set screw and the third actuator that fixes the horizontal position of the third actuator within the plate; and a third adjustment block screw mated to the third adjustment block to selectively fix the third adjustment block within the plate.

Example 22 may include the elements of example 1 where the first linear actuator includes a first housing, wherein the first shaft includes a first inner shaft and a first outer shaft, wherein the first inner shaft extends and retracts between an interior and an exterior of the first housing, wherein the first outer shaft is coupled to the first inner shaft and actuates external to the first housing.

Example 23 may include the elements of example 22 where the second linear actuator includes a second housing, wherein the second shaft includes a second inner shaft and a second outer shaft, wherein the second inner shaft extends and retracts between an interior and an exterior of the second housing, wherein the second outer shaft is coupled to the second inner shaft and actuates external to the second housing.

According to example 24, a semiconductor device testing system is provided. The semiconductor device testing system may include a tester system. The tester system may include a test computing system that acquires information about one or more devices under test; and a tester head physically and electrically coupled between a probe card and the test computing system to transfer the information from the one or more devices under test to the test computing system. The semiconductor device testing system may include a low-profile gimbal platform mechanically coupled between the probe card and the tester head to align a plane of the probe card with a plane of a semiconductor wafer of the one or more devices under test. The low-profile gimbal platform may include a plate having a first surface and a second surface; a first linear actuator horizontally positioned within the plate between the first surface and the second surface, wherein the first linear actuator includes a first shaft that extends and retracts in parallel with the first surface; a first piston coupled to the first shaft, wherein the first piston extends or retracts perpendicularly to the first surface, in response to extension or retraction of the first shaft; a second linear actuator horizontally positioned within the plate between the first surface and the second surface, wherein the second linear actuator includes a second shaft that extends and retracts in parallel with the first surface; and a second piston coupled to the second shaft, wherein the second piston extends or retracts perpendicularly to the first surface, in response to extension or retraction of the second shaft.

Example 25 may include the elements of example 24, in addition to an optic system that measures a planar error between a plane of the probe card and the plane of the semiconductor wafer. The test computing system may receive the planar error from the optic system, and the test computing system may provide correction instructions for the planar error to the low-profile gimbal platform to reduce the planar error.

Example 26 may include the elements of example 24 where the tester system tests the one or more devices under test to determine performance characteristics of the one or more devices under test, to sort the one or more devices under test into one or more categories of performance.

Example 27 may include the elements of example 24 where the tester system measures a planar error between the probe card and the semiconductor wafer of the one or more devices under test.

Example 28 may include the elements of example 27 where the planar error is measured between probe tips of probe needles of the probe card and the semiconductor wafer of the one or more devices under test.

Example 29 may include the elements of example 24 where a thickness of the plate is less than or equal to 13 millimeters.

According to example 30, a method of operating a low-profile gimbal platform to reduce planar error is provided. The method may include measuring, by a tester system, planar error between a probe card and a semiconductor wafer of one or more devices under test; determining, by the tester system, which one or more of a plurality of linear actuators in a low-profile gimbal platform to operate to reduce the planar error; and transmitting instructions to the low-profile gimbal platform to operate one or more of the plurality of linear actuators to reduce the planar error.

Example 31 may include the elements of example 30, in addition to, until the planar error is less than a predetermined threshold, repeatedly, measuring, by the tester system, the planar error between a probe card and a semiconductor wafer of one or more devices under test; determining, by the tester system, which one or more of the plurality of linear actuators in the low-profile gimbal platform to operate to reduce the planar error; and transmitting additional instructions to the low-profile gimbal platform to operate one or more of the plurality of linear actuators to reduce the planar error.

Example 32 may include the elements of example 30 where measuring the planar error may include measuring a first distance between a first location on the probe card and a first location on the semiconductor wafer; measuring a second distance between a second location on the probe card and a second location on the semiconductor wafer; and measuring a third distance between a third location on the probe card and a third location on the semiconductor wafer.

Example 33 may include the elements of example 32 where the first location on the probe card is a first probe needle tip on the probe card, wherein the second location on the probe card is a second probe needle tip on the probe card, wherein the third location on the probe card is a third probe needle tip on the probe card.

Example 34 may include the elements of example 32 where determining which one or more of the plurality of linear actuators in the low-profile gimbal platform to operate to reduce the planar error, may include identifying a minimum distance of the first distance, second distance and third distance; identifying a maximum distance of the first distance, second distance and third distance; and identifying one or more of the plurality of linear actuators that are nearest the maximum distance as the one or more of the plurality of linear actuators to operate to reduce the planar error.

Example 35 may include the elements of example 32 wherein measuring the planar error includes capture at least three images of distances between the probe card and the semiconductor wafer.

According to example 36, a probe test system is provided. The probe test system include means for measuring planar error between a probe card and a semiconductor wafer of one or more devices under test; means for determining which one or more of a plurality of linear actuators in a low-profile gimbal platform to operate to reduce the planar error; and means for transmitting instructions to the low-profile gimbal platform to operate one or more of the plurality of linear actuators to reduce the planar error.

Example 37 may include the elements of example 36 where the means for measuring the planar error may include means for measuring a first distance between a first location on the probe card and a first location on the semiconductor wafer; means for measuring a second distance between a second location on the probe card and a second location on the semiconductor wafer; and means for measuring a third distance between a third location on the probe card and a third location on the semiconductor wafer.

Example 38 may include the elements of example 36 where the first location on the probe card is a first probe needle tip on the probe card, wherein the second location on the probe card is a second probe needle tip on the probe card, wherein the third location on the probe card is a third probe needle tip on the probe card.

Example 39 may include the elements of example 36 where the means for determining which one or more of the plurality of linear actuators in the low-profile gimbal platform to operate to reduce the planar error may include means for identifying a minimum distance of the first distance, second distance and third distance; means for identifying a maximum distance of the first distance, second distance and third distance; and means for identifying one or more of the plurality of linear actuators that are nearest the maximum distance as the one or more of the plurality of linear actuators to operate to reduce the planar error.

Example 40 may include the elements of example 36 where the means for measuring the planar error captures at least three images of distances between the probe card and the semiconductor wafer.

According to example 41, a probe test system is provided that includes the low-profile gimbal platform of any of examples 1 through 23.

According to example 42, a machine-readable medium is provided that includes a plurality of instructions that, in response to be being executed on a computing device, cause the computing device to perform the elements of any of examples 30 through 35.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed:

1. A microelectronic device testing system, comprising:
a probe card;
a tester head to transfer electrical information from one or more devices under test (DUT) to a test computing system; and
a gimbal platform mechanically coupled between the probe card and the tester head to align a plane of the probe card with a plane of the one or more DUT, the gimbal platform comprising:
a plate having a first surface and a second surface;
a first linear actuator horizontally positioned within the plate between the first surface and the second surface, wherein the first linear actuator includes a first shaft that is to extend or retract in parallel with the first surface;
a first piston coupled to the first shaft, wherein the first piston is to extend or retract perpendicularly to the first surface, in response to an extension or a retraction of the first shaft;
a second linear actuator horizontally positioned within the plate between the first surface and the second surface, wherein the second linear actuator includes a second shaft that is to extend or retract in parallel with the first surface; and
a second piston coupled to the second shaft, wherein the second piston is to extend or retract perpendicularly to the first surface, in response to an extension or a retraction of the second shaft.

2. The system of claim 1 wherein a thickness of the plate is no more than 13 millimeters.

3. The system of claim 1 wherein one or more of the first linear actuator and the second linear actuator are one or more of: a piezoelectric actuator, a hydraulic actuator, a mechanical actuator, a pneumatic actuator, or an electro-mechanical actuator.

4. The system of claim 1, wherein one or more of the first linear actuator and the second linear actuator are to operate in response to receipt of one or more electrical signals received from the test computing system.

5. The system of claim 1, wherein the first shaft is at least partially sloped away from a first housing of the first actuator to slideably mate with the first piston and cause the first piston to extend perpendicularly from the first surface if in response to an extension of the first shaft from the first housing.

6. The system of claim 1, wherein the second shaft is at least partially sloped away from a second housing of the second actuator to slideably mate with the second piston and cause the second piston to extend perpendicularly from the second surface in response to the extension of the second shaft from the second housing.

7. The system of claim 1, wherein the first piston is hydraulically extended by extension of the first shaft, or the second piston is hydraulically extended by extension of the second shaft.

8. The system of claim 1, wherein a distal end of the first piston includes a first termination comprising a ball bearing, a rounded surface, a pin, a polyhedron, or a cylinder.

9. The system of claim 1, further comprising:
a third linear actuator horizontally positioned within the plate between the first surface and the second surface, wherein the third linear actuator includes a third shaft that is to extend or retract in parallel with the first surface; and
a third piston coupled to the third shaft, wherein the third piston is to extend or retract perpendicularly to the first surface, in response to an extension or a retraction of the third shaft.

10. The system of claim 1, further comprising:
at least two retention pins, wherein the at least two retention pins are anchored in the plate and extend from the first surface to anchor to a gimbal support plate; and
at least two springs mounted around each of the at least two retention pins, the springs to compress the gimbal support plate towards the first surface of the plate.

11. The system of claim 1, further comprising:
a first set screw that adjusts a horizontal position of the first actuator within the plate, to adjust a default height of the first piston relative to the first surface;
a first adjustment block positioned between the first set screw and the first actuator that is to fix the horizontal position of the first actuator within the plate; and a first adjustment block screw mated to the first adjustment block to selectively fix the first adjustment block within the plate.

12. The system of claim 11, further comprising:

a second set screw that is to adjust a horizontal position of the second actuator within the plate, to adjust a default height of the second piston relative to the first surface;

a second adjustment block positioned between the second set screw and the second actuator that is to fix the horizontal position of the second actuator within the plate;

a second adjustment block screw mated to the second adjustment block to selectively fix the second adjustment block within the plate;

a third set screw that is to adjust a horizontal position of a third actuator within the plate, to adjust a default height of a third piston relative to the first surface;

a third adjustment block positioned between the third set screw and the third actuator that is to fix the horizontal position of the third actuator within the plate; and a third adjustment block screw mated to the third adjustment block to selectively fix the third adjustment block within the plate.

13. The system of claim 1, further comprising:

an optic system that measures a planar error between a plane of the probe card and the plane of the one or more DUT, wherein the test computing system receives the planar error from the optic system, and wherein the test computing system provides correction instructions to the gimbal platform to reduce the planar error.

14. The system of claim 1, wherein the system determines a planar error between the probe card and the the one or more DUT.

15. The system of claim 14 wherein the planar error is measured between probe tips of probe needles of the probe card and the one or more DUT.

16. The system of claim 1, wherein a thickness of the plate is less than or equal to 12.7 millimeters.

* * * * *